(12) United States Patent
Adkisson et al.

(10) Patent No.: US 7,964,967 B2
(45) Date of Patent: Jun. 21, 2011

(54) HIGH SURFACE AREA ALUMINUM BOND PAD FOR THROUGH-WAFER CONNECTIONS TO AN ELECTRONIC PACKAGE

(75) Inventors: James W. Adkisson, Jericho, VT (US);
Jeffrey P. Gambino, Westford, VT (US);
Mark D. Jaffe, Shelburne, VT (US);
Richard J. Rassel, Colchester, VT (US);
Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 12/046,737

(22) Filed: Mar. 12, 2008

(65) Prior Publication Data

US 2008/0150147 A1    Jun. 26, 2008

Related U.S. Application Data

(62) Division of application No. 10/904,677, filed on Nov. 23, 2004, now Pat. No. 7,361,581.

(51) Int. Cl.
*H01L 23/48* (2006.01)
*H01L 23/52* (2006.01)
*H01L 29/40* (2006.01)

(52) U.S. Cl. ..... 257/758; 438/612; 438/622; 257/E23.16

(58) Field of Classification Search ............... None
See application file for complete search history.

(56) References Cited

U.S. PATENT DOCUMENTS

| | | | |
|---|---|---|---|
| 4,786,545 A * | 11/1988 | Sakuma et al. | 428/209 |
| 5,545,589 A * | 8/1996 | Tomura et al. | 438/119 |
| 5,686,762 A * | 11/1997 | Langley | 257/775 |
| 5,703,408 A | 12/1997 | Ming-Tsung et al. | |
| 5,834,365 A | 11/1998 | Ming-Tsung et al. | |
| 6,060,378 A | 5/2000 | Rolfson | |
| 6,110,816 A * | 8/2000 | Huang et al. | 438/612 |
| 6,242,813 B1 * | 6/2001 | Huang et al. | 257/784 |
| 6,316,835 B1 | 11/2001 | Chen et al. | |
| 6,586,839 B2 | 7/2003 | Chisholm et al. | |
| 6,639,303 B2 | 10/2003 | Siniaguine | |
| 6,716,737 B2 | 4/2004 | Plas et al. | |
| 6,742,701 B2 * | 6/2004 | Furuno et al. | 228/205 |
| 6,884,717 B1 | 4/2005 | Desaivo et al. | |
| 7,233,067 B2 * | 6/2007 | Takano | 257/737 |
| RE40,819 E * | 7/2009 | Langley | 257/775 |
| 2003/0049923 A1 | 3/2003 | Smoak | |
| 2003/0141103 A1* | 7/2003 | Ng et al. | 174/250 |
| 2003/0166334 A1 | 9/2003 | Lin et al. | |
| 2003/0203216 A1 | 10/2003 | Friese et al. | |
| 2004/0097002 A1 | 5/2004 | Pogge et al. | |
| 2004/0141421 A1 | 7/2004 | Cheng et al. | |
| 2005/0067708 A1 | 3/2005 | Burrell et al. | |

(Continued)

FOREIGN PATENT DOCUMENTS

GB    2208119 A    3/1989

*Primary Examiner* — Jarrett J Stark
(74) *Attorney, Agent, or Firm* — Scully, Scott, Murphy & Presser, P.C.

(57) ABSTRACT

A bond pad for effecting through-wafer connections to an integrated circuit or electronic package and method of producing thereof. The bond pad includes a high surface area aluminum bond pad in order to resultingly obtain a highly reliable, low resistance connection between bond pad and electrical leads.

11 Claims, 5 Drawing Sheets

U.S. PATENT DOCUMENTS

| | | |
|---|---|---|
| 2005/0077630 A1 | 4/2005 | Kirby et al. |
| 2005/0112861 A1 | 5/2005 | Fitzsimmons et al. |
| 2006/0097400 A1* | 5/2006 | Cruz et al. .................. 257/774 |
| 2006/0214266 A1 | 9/2006 | Jordan |
| 2008/0045003 A1* | 2/2008 | Lee et al. .................... 438/623 |
| 2008/0185735 A1* | 8/2008 | Pham et al. .................. 257/778 |
| 2008/0233733 A1* | 9/2008 | Lin .............................. 438/617 |

* cited by examiner

US 7,964,967 B2

HIGH SURFACE AREA ALUMINUM BOND PAD FOR THROUGH-WAFER CONNECTIONS TO AN ELECTRONIC PACKAGE

CROSS-REFERENCE TO RELATED APPLICATION

This application is a divisional of co-pending U.S. application Ser. No. 10/904,677, filed Nov. 23, 2004.

BACKGROUND OF THE INVENTION

1. Field of the Invention

The present invention relates to the provision of a bond pad for effecting through-wafer connections to an integrated circuit or electronic package, and which pad comprises a high surface area aluminum bond pad in order to resultingly obtain a highly reliable, low resistance connection between bond pads and electrical leads.

In the current state-of-the-technology, through-wafer connections are frequently employed in the formation of advanced types of electronic packages, for instance, such as, but not limited to, 3D packaging, MEMS packaging, or CMOS imager packaging. In particular, the process which is utilized for these connections is designed to etch a via through the rear side of the wafer and through the bond pads, so as to expose the edges of the respective bond pads. Leads are then formed so as to connect the edges of the bond pads to solder bumps, which are arranged on the rear sides of the electronic package. Thus, for multilevel aluminum (Al) wiring, multiple levels are employed in order to form the connection between the leads and the bond pads so as to be able to obtain low resistance electrical connections. However, when employing (Cu) copper wiring, this particular approach is subject to a poor or relatively low degree of reliability in the use of multiple Cu levels to form connections between the bond pads and leads, as a consequence of oxidation and corrosion of the copper material. A single aluminum pad is frequently employed as a final metal layer in Cu interconnect processes. Nevertheless, the use of such a single aluminum bond pad in effecting a connection to the leads may result in the formation of a high resistance connection, which has an adverse effect on reliability and may generate a high degree of heat shortening the service life of the electronic package in which it is installed.

Various aspects of the applicable technology have been developed, and prior art publications are in existence, which address themselves to the concept of employing vias under bond pads to provide for through-wafer connections or for the protection of underlying dielectrics. However, these constructions require either an extra mask, for instance, such as for through-wafer connections, or alternatively, necessitate that a metal layer be arranged beneath the via for the protection of underlying dielectrics.

2. Discussion of the Prior Art

Chisholm, et al., U.S. Pat. No. 6,586,839 B2 disclose the provision of vias beneath bond pads, which vias are intended to protect low-k dielectrics from sustaining any damage. These vias land on the underlying metal; and are required to employ this structure in order to mechanically strengthen the latter. This, however, requires the provision of arranging metal below the vias, inasmuch as such metal would of necessity be copper and would be subject to being exposed to ambient conditions and thereby susceptible to corrosion. In contrast to this prior art, which is plainly used for mechanical or structural integrity of low-k dielectrics beneath a bond pad, the inventive approach is intended to improve the electrical characteristics and increase cross section area of contacts from pads to leads on the backside of wafer.

Rolfson, U.S. Pat. No. 6,060,378 discloses the formation of a thick bond pad by adding a dielectric and a mask, and forming a thick damascene metal pad on top of a standard bond pad. Although this is somewhat similar to a general aspect of the present invention, in which the latter adds metal to the top of a bond pad using a shadow mask or selective plating, in contrast with the prior art the inventive approach resides in that there is an elimination of any deposit of additional layers over the remainder of the chip, inasmuch as such additional layers would be detrimental to the microlens, or similar MEMS structures.

With regard to the disclosures of Siniaguine, U.S. Pat. No. 6,639,303 B2; Cheng, et al., U.S. Patent Publication No. 2004/0141421 A1; and Pogge, et al., U.S. Patent Publication No. 2004/0097002 A1, these all require the application of an extra mask in order to produce through wafer vias below a bond pad. These vias extend all the way through a silicon wafer, whereas contrastingly, pursuant to the invention the via only extends through the dielectric on top of the silicon (Si), so as to structurally, distinguish over these patent publications.

SUMMARY OF THE INVENTION

To the contrary, in order to provide clear distinctions and advantages over the current state-of-the-art, pursuant to the invention there are employed vias or via bars beneath an aluminum bond pad in order to increase the cross-sectional contact area of metal, such as when there is provided a cut through the bond pad for electronic packaging. Pursuant to the present invention, there are provided advantages over the prior art in that there is eliminated the need for an extra mask in order to form the via or via bar, and whereas moreover, there are eliminated the arranging of metal lines beneath the via bar, this being an undesirable aspect as is presented in the prior art, inasmuch as such metal lines would normally be constituted of copper and would be exposed to an ambient environment during package forming and, consequently, subject to potentially corrosive conditions.

Accordingly, an object of the present invention is directed to utilizing various novel and unique aspects in that there are provided via bars under a bond pad pursuant to the first embodiment, and in an alternative manner, according to another embodiment there is added metal to the top of a bond pad in order to provide an extended or additional contact area to thereby produce a high surface area aluminum bond pad for the formation of a through-wafer connection to an electronic package.

BRIEF DESCRIPTION OF THE DRAWINGS

Reference may now be made to the following detailed description of the preferred embodiments of the invention, taken in conjunction with the accompanying drawings; in which.

DETAILED DESCRIPTION OF THE INVENTION

Figure 1A:
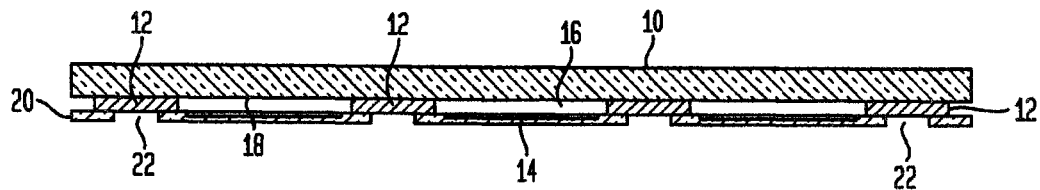
FIGS. 1A through 1C describe sequential steps in the formation of the etching of vias in the back sides of an electronic package, and then forming the leads to connect the edges of bond pads to solder bumps in accordance with the prior art.
Figure 1B:
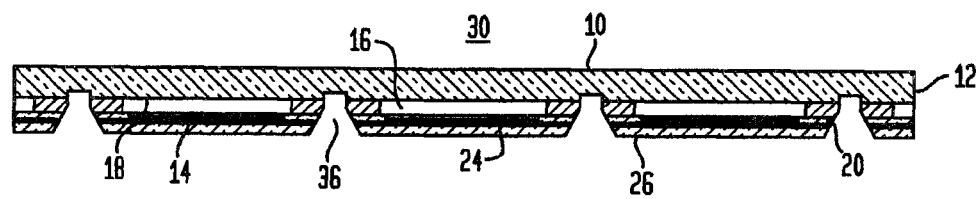
Figure 1C:
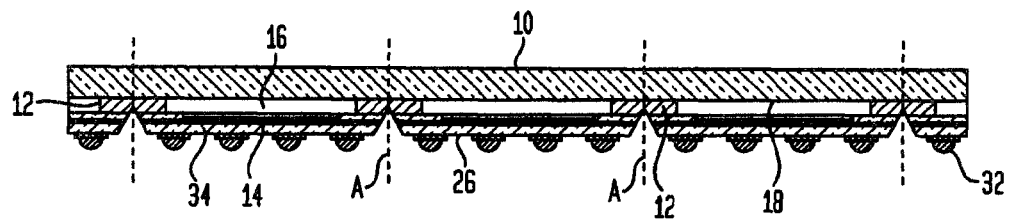

Referring to FIGS. 1A through 1C of the drawings, setting forth a prior art example of producing an electronic package, this is directed to a process for forming through-wafer connections by etching a via through the backside of a wafer and through bond pads, so as to expose the edges of the pads.

Hereby, as shown in FIG. 1A of the drawings, a front glass plate 10 has a plurality of spacer rims 12 attached thereto, and a die 14 is located to form a cavity 16 between the backside 18 of the front glass plate 10 and a silicon pad 20, etches 22 are implemented from the backside of the die so as to form I/Os (inputs/outputs) to the die. Thereafter, as shown in FIG. 1B of the drawings, a layer of glue 24 is employed to attach a back glass plate 26, and notching at angles to a normal is implemented for forming the initial structure 30 prior to singulation (by dicing).

Figure 2A:
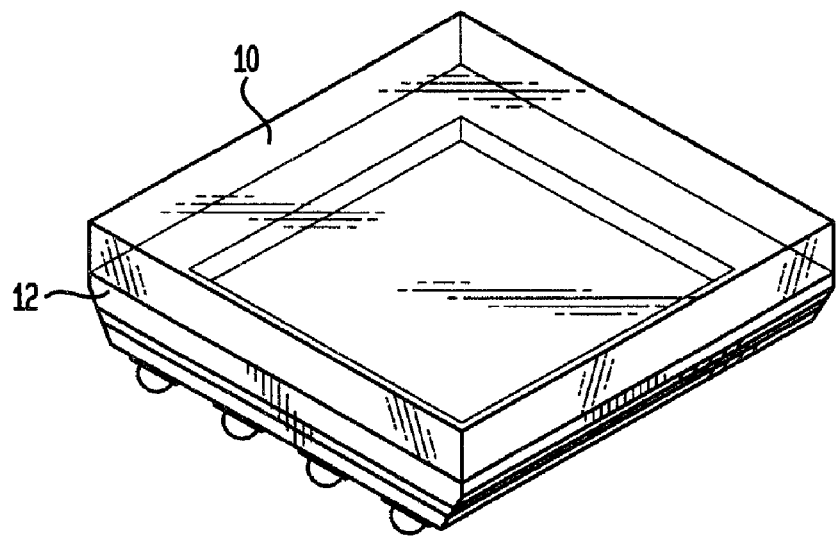
FIGS. 2A and 2B illustrate, respectively, perspective and enlarged views of a section of the bond pads and leads after singulation pursuant to the prior art.
Figure 2B:
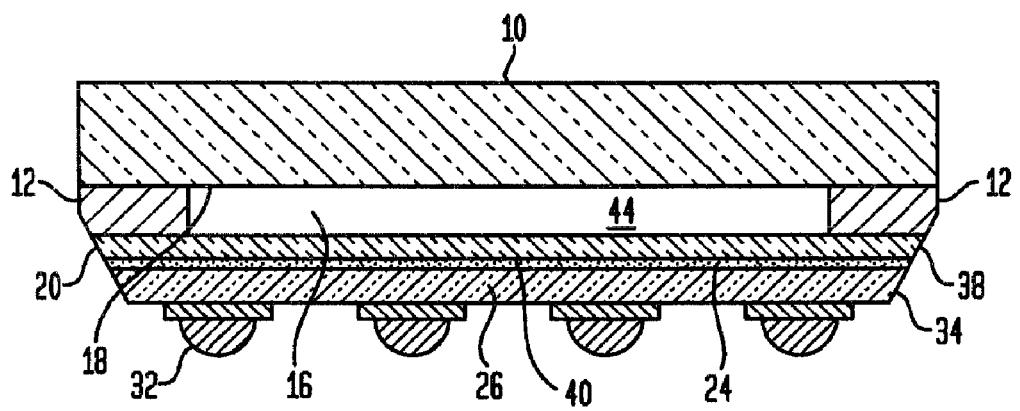

Thereafter, as shown in FIG. 1C of the drawings, BGA solder bumps 32 are suitably fastened to the back plate and leads 34, which are connected extending along the notched surface 36 so as to connect to bond pads 38 formed beneath the spacer rim portions 12. Thereafter, final dicing along lines A is implemented to provide for singulation and to form discrete structures, as shown in FIGS. 2A and 2B of the drawings. In this instance, as illustrated, epoxy 40 attaches the silicon 20 to the back glass plate 26 and attachment surfaces are also provided for the BGA solder bumps 32 and the back surface of the back glass plate.

As set forth hereinabove, the spacer rims area comprise the bond pads 38, which are connected to the BGA solder bumps 32 by means of leads 34 extending along the angularly notched sides of the structure. A cavity 44 is formed below the back surface of the front glass plate 10 and the cavity provides an optically or mechanically sensitive area, as is known in the technology.

Figure 3:
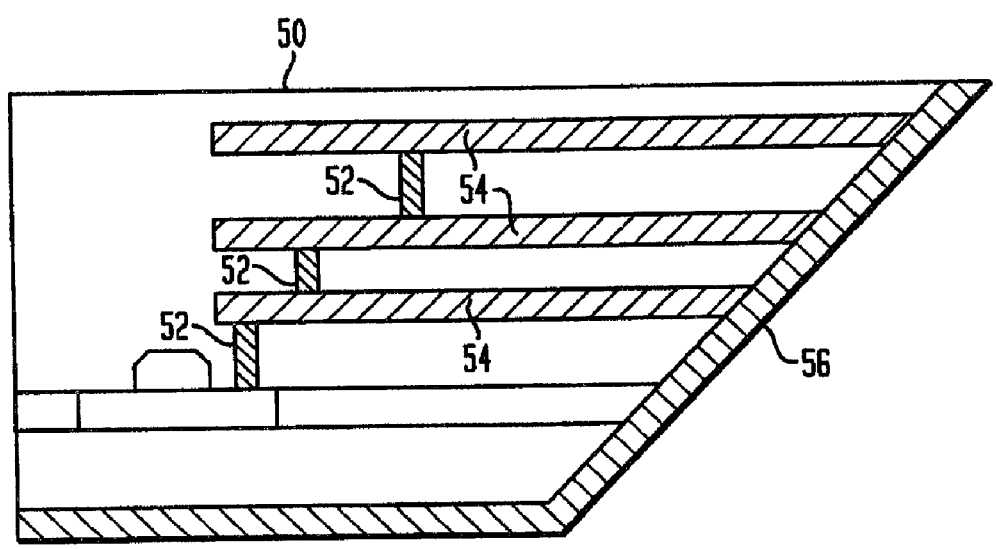
FIG. 3 illustrates an enlarged diagrammatic detail of a portion of the bond pads and lead connection pursuant to the prior art.

As shown in the enlarged detail of FIG. 3, this structure 50 discloses prior art multi-level aluminum-tungsten vias 52 with multi-level bond pads 54 to form connections between the leads 56 and the bond pads 54. This essentially provides a low-resistance connection to the aluminum and tungsten via structures; however, due to the use of copper wiring, normally employing multiple-level through connections between the bond pads and leads, poor reliability may be encountered due to oxidation and corrosion of the copper. Moreover, a single aluminum pad is frequently employed as the final metal layer in the copper interconnect processes and, if connected to the leads, may produce a high-resistance connection, with the attendant drawbacks.

The present invention may use a single aluminum pad, but increases the surface area of this pad by forming via bars of either W (via bar width<2× the thickness of W) or W+Al (via bar width>2× the thickness of W) underneath the pad, or alternatively by adding metal on top of the pad.

Via bars can be formed using the standard via mask or by using an additional mask. The depth of the via bar can be enhanced in two ways: (1) use RIE (reactive ion etch) lag to obtain a much greater etch depth for the via bar compared to the via, or (2) use an additional mask to form the via bars before the vias. Hereby, the surface area can also be increased by using an isotropic etch of the dielectric which is selective with regard to the metal (dilute HF for $SiO_2$ dielectric, $O_2$ plasma for organic dielectric), so as to recess the edge of the package via with respect to the metal.

Figure 4A:
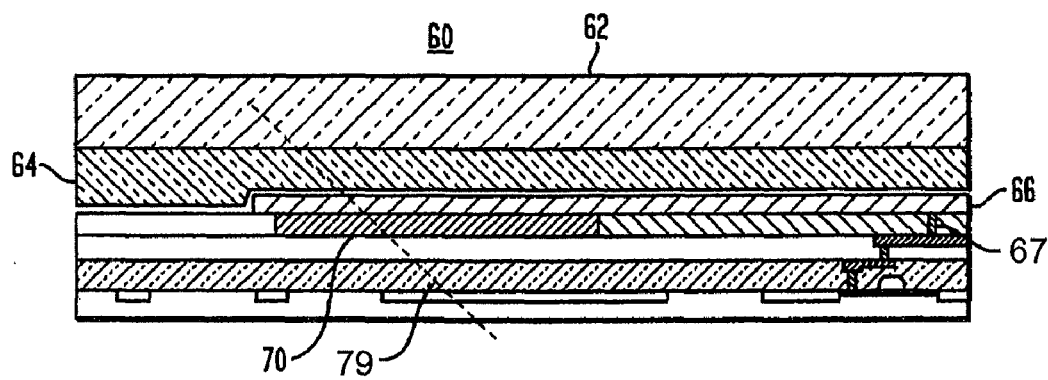
FIGS. 4A through 4C illustrate sequential steps in the formation of a first embodiment of a structure utilizing via bars underneath bond pads pursuant to the invention.
Figure 4B:
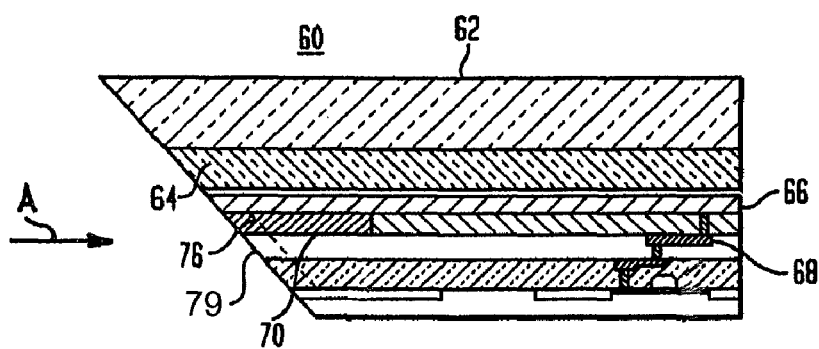
Figure 4C:
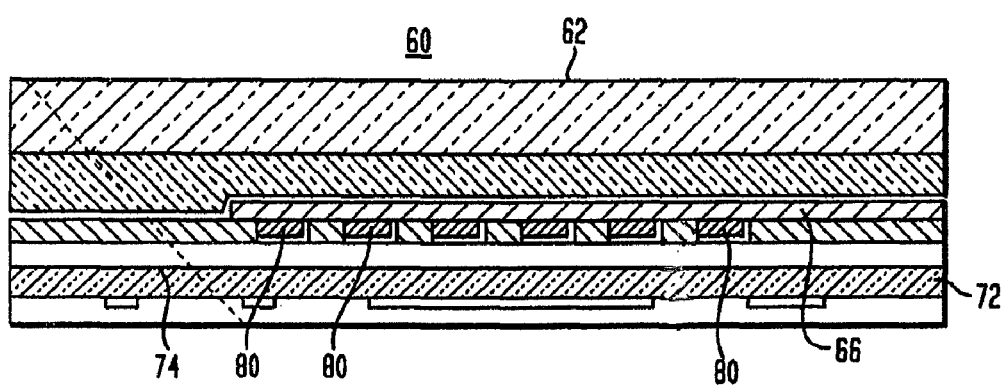

A first one of these inventive embodiments (W+Al via bar, no additional masks) is shown in FIGS. 4A through 4C of the drawings.

Reverting in greater particularity to the drawings, and especially the first embodiment as exemplified in FIGS. 4A through 4C, there is diagrammatically shown in FIG. 4A a side view of an electronic package 60 a notch has been formed to expose the bond pads. Provided is a glass plate 62, the back surface thereof includes a polymer layer 64, and along the edges at one side consisting of silicon dioxide or silicon nitrate, and the rear surface of which is contacted an Al or aluminum bond pad 66. A via 67 is provided beneath the bond pad 66. Tungsten (W) via bars 68 are provided at one end of bond pad 66, to provide connection to the circuits. Tungsten (W) via bar 70 is provided beneath the bond pads 66, and therebeneath a further glass plate is bonded thereto by means of epoxy and which forms the rear surface for the attachment thereto of BGA solder bumps (not shown). As shown in FIG. 4B of the drawings, which is a side view after the via etch has been implemented to the electronic package 60, there is indicated that in the structure thereof an optional isotropic etch 76 may be provided extending diagonally across one edge so as to increase the surface area of the bond pad 66. The via bars can also be formed from metals, such as tungsten, a combination of tungsten and aluminum, Cr, Au, Ni, NiMoP, Co, CoWP or CoWB.

As shown in an edge view of the electronic package in the direction of the arrow A in FIG. 4B, in FIG. 4C there are shown the various tungsten and aluminum via bars 80 beneath the aluminum bond pad 66, which provide for an increased surface area for a low resistance electrical contact.

As previously noted, the edge 79 of the electronic package 60 may be cut at an angle relative to the normal for positioning of the leads interconnecting the bond pads. This eliminates the need for applying of the additional masks, as is provided for in the prior art.

As indicated, an RIE lag can be used so that via bars 70 are at a greater depth than via bars 68, and the isotropic etch, which is optional of the dielectric may be provided in connection with the type of metal employed where dilute HF is employed for SiO2 dielectric, and O2 plasma for an organic dielectric, for recessing or angling the edge of the package with regard to the metal. This also eliminates the requirement for an additional mask in comparison with the prior art, as shown for the invention in FIGS. 4A through 4C.

Figure 5A:
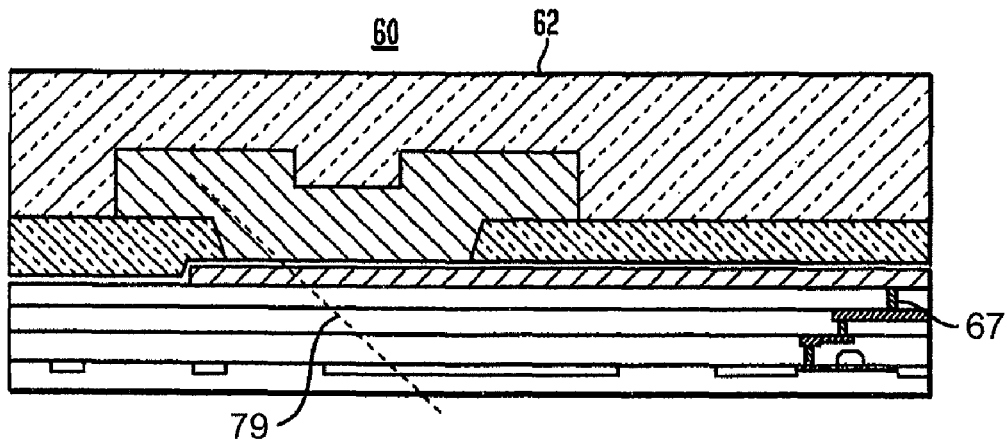
FIGS. 5A and 5B illustrate a further embodiment showing sequential steps of adding metal to the top of a bond pad, respectively, before and after package via etch pursuant to the invention.
Figure 5B:
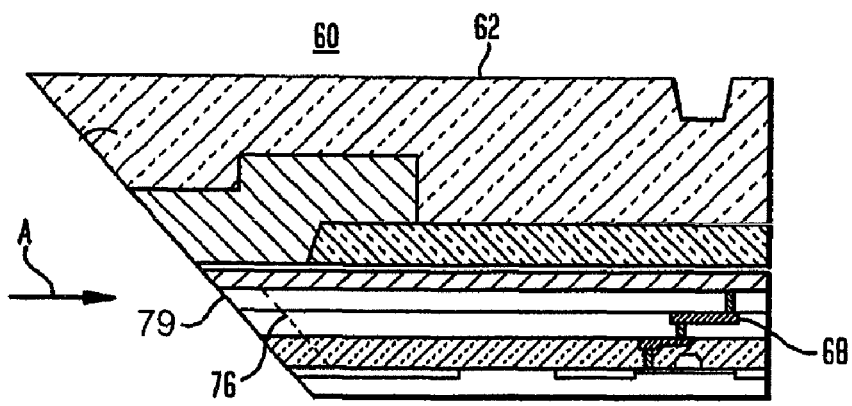

As shown in the embodiment of FIGS. 5A and 5B, in which the same reference numerals are used as in the previous embodiment for identical or similar elements, in this instance, an additional metal layer, such as aluminum, gold, silver, silicon based solder, lead based solder, palladium, platinum, chromium, nickel, copper or alloys thereof can be added on top of the bond pad after forming a terminal via. The additional metal is formed, as shown in FIG. 5A, by using a shadow mask to deposit the metal, wherein the aluminum is evaporated, and, if required as well, a barrier layer, such as of titanium, tantalum, tungsten, tantalum nitrate, tungsten nitrate, or titanium tungsten. These materials are not shown in the drawings.

Suitable electroplating or electroless plating may be employed to add the metal layer, whereby electroless plating requires no additional masks. On the other hand, electroplating will require one or two additional masks, which define a seed layer used to electroplate metal, as is known in the art.

Thereafter, an optional isotropic etch may be applied, as in the previous embodiment, as shown in the side view of FIG. 5B, after an electronic package etch, so as to increase the bond pad surface at an essentially angular relationship relative to the normal.

Figure 6A:
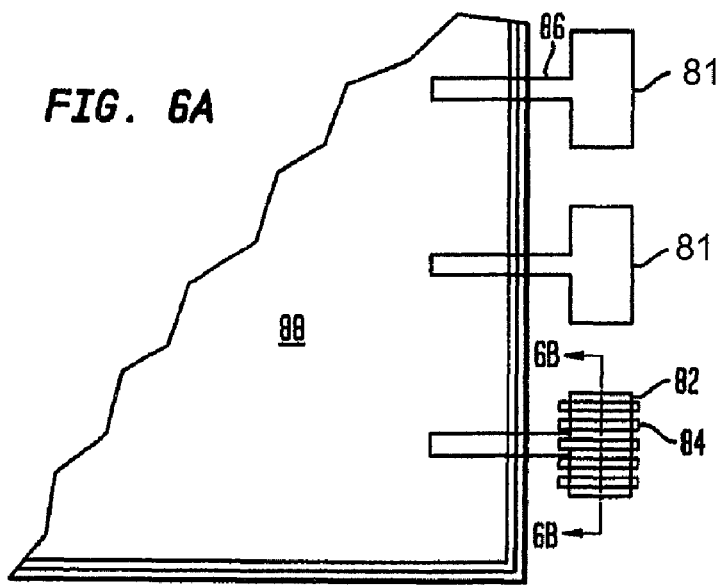
FIGS. 6A and 6B illustrate, diagrammatically, plan and end views of typical corrugated aluminum pads with slotted vias therebeneath.
Figure 6B:

From the foregoing, it is also shown in FIGS. 6A and 6B, that each aluminum pad 81 may have slotted vias 82 provided under the respective bond pad into which the tungsten via bars 84 can be inserted and connected by means of leads 86 to the electronic package structure 88, as shown in FIG. 6A and sectional view of FIG. 6B.

From the foregoing, it becomes apparent by the invention that a highly reliable connection is produced, which avoids the use of copper for the connection between bond pads and leads, thereby reducing any possibility of corrosion; and there is also provided a low-resistance connection between the bond pads and the leads due to the high cross-sectional surface area, and also the possibility of utilizing single layer aluminum bond pads.

A particular use of the invention may also be ascertained in that it can be utilized in chip scale packaging (CSP) resulting in smaller integrated circuit package sizes. Further, in another application of the invention, there may be utilized CMOS image sensors, which benefit from the resultingly smaller packages, since a reduction in the size of a CMOS image sensor package enables the installation and utilization thereof in cell phone cameras. Pursuant to another application of the invention, there may be utilized MEMS sensors, which benefit from the resultantly smaller packages, since a reduction in the size of a MEMS sensor package enables the installation and utilization thereof in consumer portable electronics (GPS devices, and the like).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. An arrangement, comprising:
a bond pad effectuating a through-wafer connection to an integrated circuit chip or electronic package; and
said bond pad incorporating a high surface contact area forming a low-electrical resistance connection between said bond pad and electrical leads of said integrated circuit or electronic package;
wherein said high surface contact area comprises via bars formed at a bottom surface of said bond pad for increasing the contact area of said bond pad, and said bond pad includes a diagonal edge, said diagonal edge being formed using an isotropic etch so as to increase an electrical side contact surface of said bond pad;
wherein said via bars contact said bottom surface of said bond pad, and at least one of said via bars is connected to a vertically extending via which extends to a lower via bar in said arrangement.

2. An arrangement comprising a bond pad as claimed in claim 1, wherein said bond pad is constituted of aluminum and said via bars are constituted of materials which are resistant to corrosion from applicable ambient conditions, and which are selected from the group of metals consisting of tungsten, a combination of tungsten and aluminum, Cr, Au, Ni, NiMoP, Co, CoWP or CoWB.

3. An arrangement comprising a bond pad as claimed in claim 1, wherein a plurality of said bond pads are each connected to electrical leads, a plurality of slotted said vias being arranged below each of said bond pads, and via bars constituted of materials which are resistant to corrosion from applicable ambient conditions, and which are selected from the group of metals consisting of tungsten or a combination of tungsten and aluminum, Cr, Au, Ni, NiMoP, Co, CoWP or CoWB, being located in each of said vias for increasing the contact areas of said bond pads.

4. An arrangement comprising a bond pad as claimed in claim 1, wherein a metal mask-forming layer is provided on the surface of said bond pad, and the surface area of said bond pad is increased.

5. An arrangement comprising a bond pad as claimed in claim 4, wherein a shadow mask provides said metal mask-forming layer of evaporated metal to be deposited on the surface of said bond pad, or said metal is deposited by a selective plating process, such as electroplating or electroless plating.

6. An arrangement comprising a bond pad as claimed in claim 4, wherein said mask-forming layer is consisting of a metal selected from the group of materials consisting of aluminum, gold, silver, silicon-based solder, lead-based solder, palladium, platinum, chromium, nickel, copper or alloys of said materials.

7. An arrangement of claim 1, wherein said vertically extending via defines slots which include said via bars being arranged below another bond pad, and an electrical lead connects said another bond pad to said electronic package.

8. An integrated circuit chip, comprising:
a side chip surface, a bond pad having a first surface extending coplanarly with said side chip surface; and
an electrical lead extending adjacent to said bond pad, said electrical lead includes a surface extending coplanarly with said side chip surface so as to increase a contact surface area for electrical coupling to said bond pad forming a low-electrical resistance connection therebetween;
wherein said increased surface contact area comprises via bars formed at a bottom surface of said bond pad for increasing the contact area of said bond pad, and said bond pad includes a diagonal edge, said diagonal edge being formed using an isotropic etch so as to increase an electrical side contact surface of said bond pad;
wherein said via bars contact said bottom surface of said bond pad, and at least one of said via bars is connected to a vertically extending via which extends to a lower via bar in the arrangement.

9. An integrated circuit chip as claimed in claim 8, wherein said bond pad is constituted of aluminum and said via bars are constituted of materials which are resistant to corrosion from applicable ambient conditions, and which are selected from the group of metals consisting of tungsten, a combination of tungsten and aluminum, Cr, Au, Ni, NiMoP, Co, CoWP or CoWB.

10. An integrated circuit chip as claimed in claim 8, wherein a plurality of said bond pads are each connected to electrical leads, a plurality of slotted said vias being arranged below each of said bond pads, and via bars constituted of materials which are resistant to corrosion from applicable ambient conditions, and which are selected from the group of metals consisting of tungsten, a combination of tungsten and aluminum, Cr, Au, Ni, NiMoP, Co, CoWP or CoWB, being located in each of said vias for increasing the contact areas of said bond pads.

11. An integrated circuit chip as claimed in claim 8, wherein a metal mask-forming layer is provided on the surface of said bond pad, and the surface area of said bond pad is increased by evaporation of metal through a shadow mask, or by selective plating processes, such as electroplating or electroless plating.

* * * * *